(12) United States Patent
Belkin et al.

(10) Patent No.: US 9,509,123 B2
(45) Date of Patent: Nov. 29, 2016

(54) GENERATING TERAHERTZ FREQUENCY COMBS FROM QUANTUM CASCADE LASERS USING NONLINEAR FREQUENCY MIXING

(71) Applicant: Board of Regents, The University of Texas System, Austin, TX (US)

(72) Inventors: Mikhail A. Belkin, Austin, TX (US); Karun Vijayraghavan, Austin, TX (US); Seungyong Jung, Austin, TX (US)

(73) Assignee: Board of Regents The University of Texas System, Austin, TX (US)

( * ) Notice: Subject to any disclaimer, the term of this patent is extended or adjusted under 35 U.S.C. 154(b) by 0 days.

(21) Appl. No.: 14/919,383

(22) Filed: Oct. 21, 2015

(65) Prior Publication Data

US 2016/0156153 A1    Jun. 2, 2016

Related U.S. Application Data

(60) Provisional application No. 62/066,746, filed on Oct. 21, 2014.

(51) Int. Cl.
| | |
|---|---|
| *H01S 5/00* | (2006.01) |
| *H01S 5/34* | (2006.01) |
| *H01S 5/10* | (2006.01) |
| *H01S 5/125* | (2006.01) |
| *H01S 5/50* | (2006.01) |

(52) U.S. Cl.
CPC .......... *H01S 5/3401* (2013.01); *H01S 5/1092* (2013.01); *H01S 5/1096* (2013.01); *H01S 5/125* (2013.01); *H01S 5/34* (2013.01); *H01S 5/5054* (2013.01)

(58) Field of Classification Search
CPC .... H01S 5/1096; H01S 5/1092; H01S 5/125; H01S 5/34; H01S 5/3401; H01S 5/5054
USPC ...................................................... 372/45.012
See application file for complete search history.

(56) References Cited

U.S. PATENT DOCUMENTS

| | | | |
|---|---|---|---|
| 7,272,158 B1 * | 9/2007 | Hayes ..................... | G02F 1/365 372/21 |
| 2010/0085992 A1 * | 4/2010 | Rakuljic ................ | G01D 5/266 372/20 |

* cited by examiner

*Primary Examiner* — Kinam Park
(74) *Attorney, Agent, or Firm* — G+J Law Group PLLC; Georgios A. Georgakis; Robert C. Jahnke (57) ABSTRACT

Methods and systems include generating one or more mid-infrared frequencies based at least upon electron transitions in one or more quantum cascade heterostructures. The quantum cascade heterostructures are concurrently configured with a significant second-order nonlinear susceptibility, a significant third-order nonlinear susceptibility, and an insignificant group velocity dispersion. A set of mid-infrared frequencies (that may include a frequency comb) is generated in the quantum cascade heterostructures based at least upon a four-wave mixing of the one or more mid-infrared frequencies. The four-wave mixing arises at least from the significant third-order nonlinear susceptibility and the insignificant group velocity dispersion. A set of terahertz frequencies (that may include a frequency comb) is generated in the quantum cascade heterostructures based at least upon a difference frequency generation from mid-infrared frequency pairs selected from the set of mid-infrared frequencies. The difference frequency generation arises at least from the significant second-order nonlinear susceptibility.

16 Claims, 10 Drawing Sheets

GENERATING TERAHERTZ FREQUENCY COMBS FROM QUANTUM CASCADE LASERS USING NONLINEAR FREQUENCY MIXING

B. CROSS REFERENCE TO RELATED APPLICATIONS

This application claims the benefit under 35 U.S.C. §119 (e) of U.S. Provisional Patent Application No. 62/066,746, filed on Oct. 21, 2014, titled "GENERATING OPTICAL TERAHERTZ FREQUENCY COMBS USING TERAHERTZ CHERENKOV DIFFERENCE-FREQUENCY GENERATION IN QUANTUM CASCADE LASERS," and naming Mikhail Belkin, Karun Vijayraghavan, and Seungyong Jung as inventors. The aforementioned application is hereby incorporated by reference herein.

A. GOVERNMENT INTEREST

The U.S. Government has certain rights in this invention pursuant to the terms of National Science Foundation Grant No. ECCS 1408511 "Broadband THz frequency comb generation in quantum cascade lasers".

C. TECHNICAL FIELD

The present disclosure relates generally to generating terahertz frequency combs, and more particularly to generating optical terahertz frequency combs using nonlinear frequency mixing in quantum cascade lasers.

D. BACKGROUND

A frequency comb is a spectrum consisting of a discrete set of equally spaced frequency elements. Frequency comb generation generally involves the combination of an optical laser source with a nonlinear process. Frequency combs can be generated by a number of mechanisms, including amplitude modulation in continuous wave lasers or stabilization of pulse trains generated by semiconductor, mode locked lasers. Four-wave mixing can be used in microresonators and quantum cascade lasers to produce frequency combs. However, frequency comb generation using existing terahertz (frequency range 0.1-10 THz) quantum cascade laser systems requires cryogenic cooling to operate and has limited bandwidth for comb generation. Optical frequency combs provide a useful tool with applications in numerous areas, including spectroscopy, metrology, sensing, ranging, and distance measurement.

E. BRIEF DESCRIPTION OF THE DRAWINGS

Other objects and advantages may become apparent upon reading the detailed description and upon reference to the accompanying drawings.

While specific embodiments are shown by way of example in the drawings and the accompanying detailed description, various other modifications and alternative forms are possible. It should be understood that the drawings and detailed description are not intended to be limiting.

F. DETAILED DESCRIPTION

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment" The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" module unit does not necessarily imply that this module unit is the first module unit in a sequence; instead, the term "first" is used to differentiate this module unit from another module unit (e.g., a "second" module unit).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements, nodes, or features being "coupled". As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Disclosed below are various concepts related to, and embodiments of, a quantum cascade laser (QCL) designed to generate terahertz (THz) frequency combs (THz FC) via difference frequency generation (DFG) between mid-infrared (mid-IR) emissions lines (with some of the mid-IR emission lines being frequency combs (FC)) generated concurrently in the QCL. For a discussion on the formation of mid-IR frequency combs in QCLs, please refer to "Mid-infrared frequency comb based on a quantum cascade laser", Andreas Hugi, Gustavo Villares, Stephane Blaser, H. C. Liu, & Jerome Faist, 13 Dec. 2012, VOL 492, NATURE LETTERS, which is hereby incorporated herein by reference, in its entirety and for all purposes.

A Cherenkov emission scheme may be utilized for broadband THz outcoupling. These devices may be operated at room temperature to output THz FCs spanning the entire 0.5-6 THz range and beyond. THz FC QCLs can enable rapid and highly sensitive broadband THz spectroscopy and spectroscopic imaging using highly-sensitive room-temperature heterodyne THz detectors, such as Schottky diodes. A QCL-based THz FC spectroscopic system would represent a significant improvement in speed, compactness, spectral resolution, and cost-effective mass-production over existing THz spectroscopic systems. Additional applications for the disclosed THz FC sources may include metrology and distance measurements.

Figure 1A:
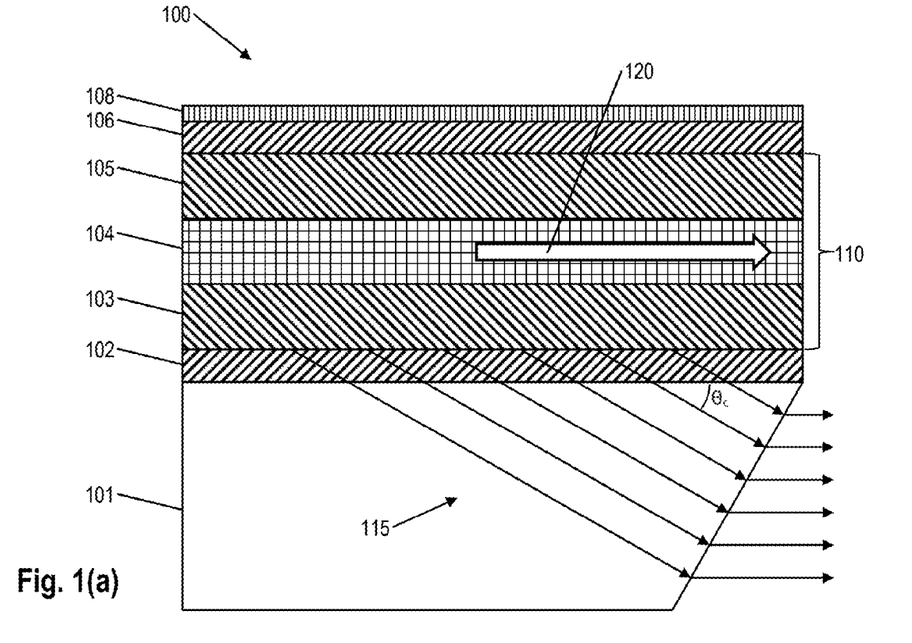
FIG. 1(a) shows a side-view of a quantum cascade laser (QCL) configured to generate terahertz frequency combs based on difference frequency generation (DFG) in an active region of the QCL, in accordance with some embodiments.

FIG. 1(a) shows a side view of a quantum cascade laser (QCL) configured to generate terahertz frequency combs based on difference frequency generation (DFG) in an active region of the QCL, in accordance with some embodiments. QCL 100 includes substrate 101, which may be comprised of a III-IV semiconductor compound, such as InP. Substrate 101 is configured to have low THz loss and low refractive index dispersion. In some embodiments, substrate 101 is formed of semi-insulating, undoped or very low doped (concentration of dopant <$10^{16}$ cm$^{-3}$) InP having an index of refraction ($n_{sub}$) in the 3.5-3.7 range for the 0.5-5 THz frequency range. In some embodiments, substrate 101 has a thickness between 100 μm and 3,000 μm. In other embodiments, substrate 101 has a thickness of less than 100 μm or more than 3,000 μm.

QCL 100 includes an active region 104 surrounded by waveguide cladding layers 103 and 105. Waveguide cladding layers 103 and 105 are disposed about active region 104 to form waveguide structure 110 to guide mid-IR radiation by which terahertz radiation is emitted by laser 100 as described below. In some embodiments, wave guide layers 103 and 105 comprise a 3 μm thick layer of n-doped InP ($n=1.5*10^{16}$ cm$^{-3}$). QCL 100 may include a current extraction layer 102, which is a thin, doped semiconductor layer, positioned on substrate 101 to improve lateral current extraction from active region 104. In some embodiments, current extraction layer comprises a 200 nm thick layer of n-doped InGaAs ($n=7*10^{17}$ cm$^{-3}$). In some embodiments, current extraction layer 102 and waveguide cladding layer 103 are the same layer.

To facilitate extraction of THz radiation along a substantial portion of the length of the waveguide 110, a Cherenkov phase matching scheme may be utilized. Cherenkov emission occurs when the phase velocity of the nonlinear polarization wave in a thin slab of nonlinear optical material is faster than the phase velocity of the THz radiation in the medium surrounding the slab. By suitably configuring the refractive indices of waveguide 110 and substrate 101, the THz radiation generated in active region 104 may be efficiently extracted out of waveguide 110.

Figure 1B:
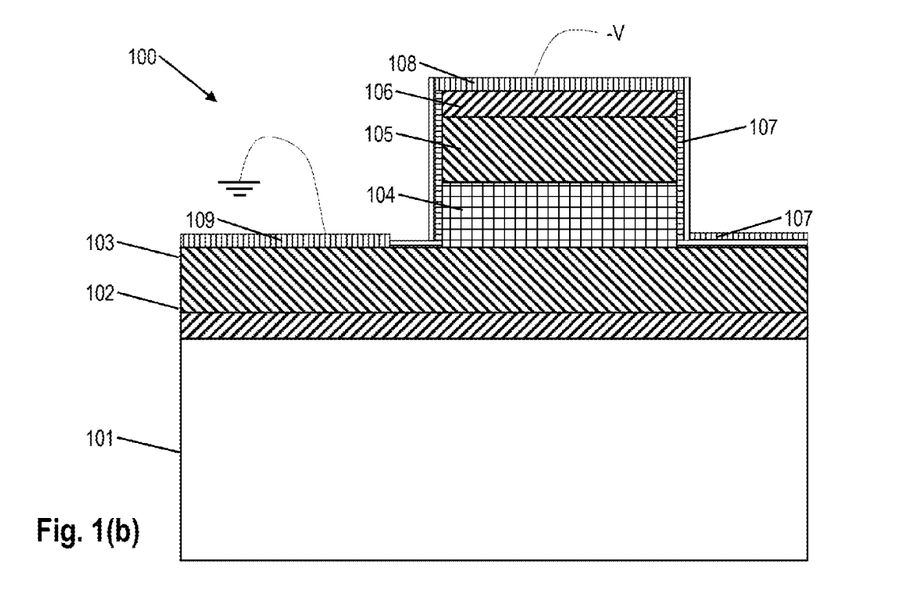
FIG. 1(b) shows a cross-sectional view of the QCL in FIG. 1(a), in accordance with some embodiments.

One or more contact layers, such as contact layers 106 and 108 shown in FIG. 1(a), may be employed to facilitate the application of current through active region 104. Contact layer 106 is formed on an upper surface of waveguide cladding layer 105. Contact layer 108 is formed on an upper surface of contact layer 106. In some embodiments, contact layer 108 is a metal that includes gold. In some embodiment contact layer 106 may be omitted and contact layer 108 may be formed directly over waveguide cladding layer 105. To avoid total internal reflection at the front facet of QCL 100 of the THz radiation emitted into substrate 101 via the Cherenkov process, the front portion of substrate 101 should be cut and polished at a suitable angle, as shown in FIG. 1(a). In some embodiments, such angle is in the range 20°-30°. A THz anti-reflective coating may be applied to the polished substrate facet to improve THz outcoulping efficiency, and a high reflective coating may be applied the back facet of QCL 100 to improve intracavity intensity of the generated mid-infrared and THz radiation FIG. 1(b) shows a cross-sectional view of the quantum cascade laser in FIG. 1(a), in accordance with some embodiments. Insulation layer 107 is shown formed along the lateral walls of active region 104, waveguide cladding layer 105, and contact layer 106 and portions of the upper surface of waveguide cladding layer 103 adjacent to such lateral walls. In some embodiments, insulation layer 107 comprises a 400 nm thick layer of silicon nitride. Contact layer 109 is formed over a portion of the upper surface of waveguide cladding layer 103 to provide a contact to ground in accordance with some embodiments. In some embodiments, the chemical composition of contact layer 109 is the same as that of contact layer 108.

Active region 104 includes one or more quantum cascade heterostructures configured to have concurrent second-order nonlinear susceptibility ($\chi^{(2)}$), significant third-order nonlinear susceptibility ($\chi^{(3)}$), and insignificant group velocity dispersion (GVD). Quantum engineering of the quantum cascade heterostructures energy subband states (and intersubband transitions between such states) may be utilized to provide resonant enhancement of $\chi^{(2)}$ and $\chi^{(3)}$ (additional details for calculating these higher order susceptibilities are provided below). In general, $\chi^{(2)}$ and $\chi^{(3)}$ may be considered significant when they are orders of magnitude greater than second and third order nonlinear susceptibilities of comparable materials that have not been engineered in accordance with the present disclosure. GVD is considered insignificant when it is zero or approximately zero, as discussed below in more detail.

Each quantum cascade heterostructure includes a plurality of quantum cascade stages, with each stage comprising a series of alternating barrier and well layers. In some embodiments, quantum cascade stages may be arranged as a InGaAs/InAlAs multiple quantum well structures that use InGaAs in quantum well layers and InAlAs in quantum barrier layers. The number of quantum cascade stage repetitions in a quantum cascade heterostructure is set suitably and is, for example, approximately 10-80 in some embodiments. In some embodiments, the one or more heterostructures are configured to have a broad mid-IR spectral gain bandwidth spanning anywhere from 1 THz-10 THz. In some embodiments, one or more of the quantum cascade heterostructures includes at least one bound-to-continuum structure.

As discussed in more detail below, one or more quantum cascade heterostructures within active region 104 are configured to generate a set of mid-IR frequencies based at least upon four-wave mixing (FWM) of one or more mid-IR frequencies generated by the one or more quantum cascade heterostructures arising at least from the integration of significant third-order nonlinear susceptibility and insignificant group velocity dispersion in the active region. In some embodiments, the set of mid-IR frequencies may include: a mid-IR frequency comb; a mid-IR frequency comb and a single frequency above or below the comb; any other combination of mid-IR frequencies. The mid-IR frequencies may represent the mid-IR pump frequencies associated with the QCL. Concurrently, the one or more quantum cascade heterostructures are also configured to generate a terahertz frequency comb based at least upon the second-order nonlinear optical process of difference-frequency generation between mid-infrared emission lines (with some of the mid-IR emission lines forming frequency combs (FC)).

In some embodiments, a single quantum cascade heterostructure may be configured to generate the one or more mid-IR frequencies used to generate the set of mid-IR frequencies. In other embodiments, two quantum cascade heterostructures may be used, with a first quantum cascade heterostructure configured to generate a first mid-IR frequency and a second quantum cascade heterostructure configured to generate a second mid-IR frequency, wherein the set of mid-IR frequencies results from four wave mixing of the first and second mid-IR frequencies.

Figure 2:
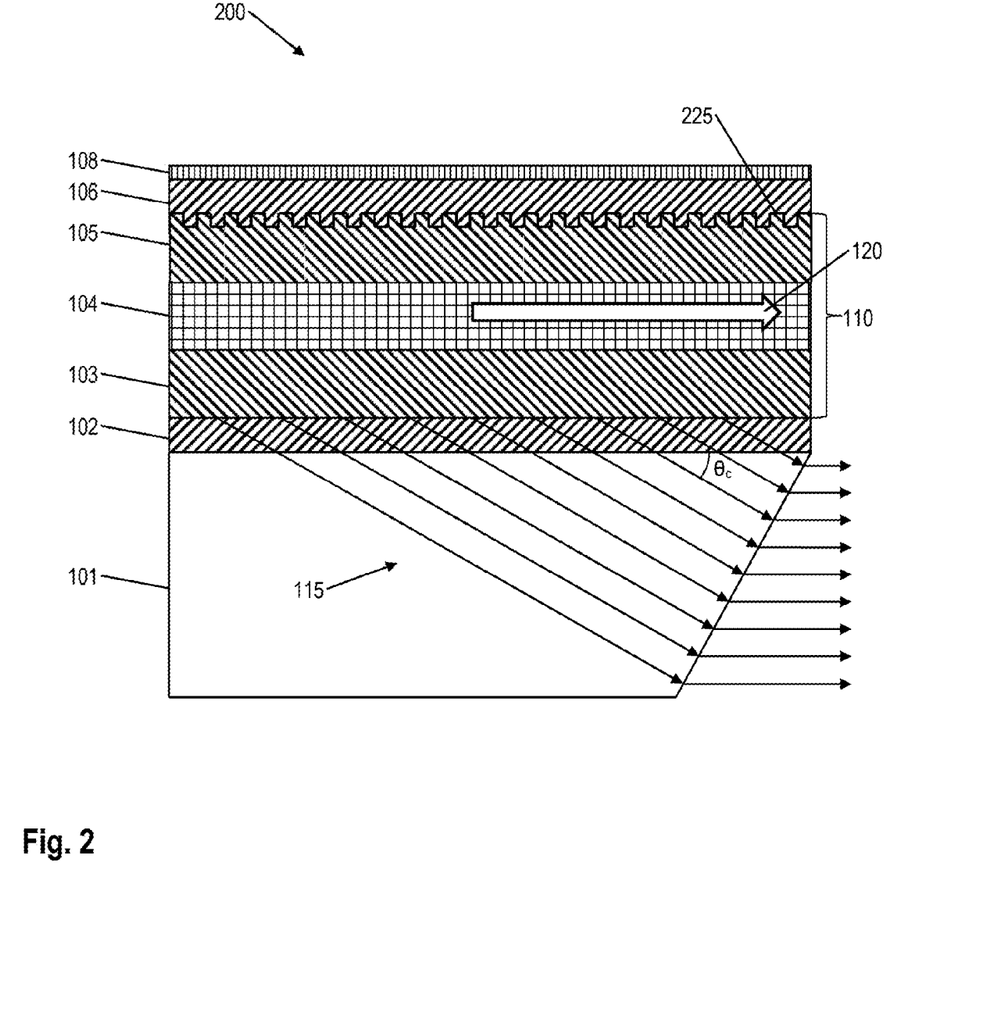
FIG. 2 shows a side-view of a QCL employing a feedback grating, in accordance with some embodiments.

FIG. 2 is a side-view illustration of a quantum cascade laser employing a feedback grating, in accordance with some embodiments. The construction of QCL 200 is similar to that of QCL 100, and the elements of the QCL device shown in FIG. 2 that utilize the elements of QCL 100 in FIG. 1(a) reference the element numbers discussed in connection with FIGS. 1(a) and 1(b). QCL 200 is shown with feedback grating 225 etched into waveguide cladding layer 105. Feedback grating 225 may be used to select and fix a single mid-IR pump frequency from the set of mid-IR frequencies generated by the one or more quantum cascade heterostructures in active region 104. In some embodiments, feedback grating is configured as a distributed feedback grating. In other embodiments, feedback grating 225 is constructed as a distributed Bragg reflector (DBR). Although feedback grating 225 is shown extending along the entire length of waveguide cladding layer 105, it should be appreciated that the feedback grating may be deployed over a portion of waveguilde cladding layer 105 that is less than the entire length. Additionally, in cases where a DBR is utilized, feedback grating may be configured to comprise multiple DBRs, where each DBR is configured to select a different mid-IR frequency and each DBR is configured to be independently biased by current, thereby allowing QCL 200 to provide lasing at set of such mid-IR frequencies by suitably adjusting the bias for each DBR. An example of a dual DBR feedback grating system is described in Vijayraghavan, K. et al., "Broadly tunable terahertz generation in mid-infrared quantum cascade lasers," Nature Comm., 4. 2021 (2013), which is hereby incorporated by reference herein, in its entirety and for all purposes. Additional relevant information is described in S. Jung, A. Jiang, Y. Jiang, K. Vijayraghavan, X. Wang, M. Troccoli, and M. A. Belkin "Broadly tunable monolithic room-temperature terahertz quantum cascade laser sources," Nature Comm., 5, 4267 (2014), which is hereby incorporated by reference herein, in its entirety and for all purposes.

Operation of THz FC QCLs in accordance with some embodiments is illustrated in FIG. 1(a). Employing a Cherenkov emission scheme, waveguide 110 may be configured so that that mid-IR frequency radiation 120 generated in active region 104 propagates along the waveguide, while THz frequency radiation 115 generated via the DFG process in the active region 104 is emitted into substrate 101 at a "Cherenkov" angle $\theta_c$ given as:

$$\cos(\theta_c) = \frac{\beta_1 - \beta_2}{k_{THz}} = \frac{n_g}{n_{sub}}, \quad (1)$$

where $\beta_1$ and $\beta_2$ are the propagation constants of the two mid-IR frequencies, $\omega_1$ and $\omega_2$, generated in active region 104, $k_{THz}$ is the k-vector of the terahertz wave at frequency $\omega_{THz} = \omega_1 - \omega_2$ in the substrate, $n_g$ is the group refractive index of the mid-IR pump modes, and $n_{sub}$ the refractive index of the substrate at $\omega_{THz}$.

In some embodiments, substrate 401 is comprised of undoped InP that is configured with low THz loss and low refractive index dispersion with $n_{sub}$ varying in the 3.5-3.6 range for 0.5-5 THz light frequencies. The value of $n_g$ for a typical $TM_{00}$ mid-IR QCL waveguide mode is approximately 3.35 and Eq. (1) yields a Cherenkov angle of approximately $\theta_c \approx 20°$-$24°$ in the 0.5-5 THz range. Given a typical intersubband transition linewidth of approximately 10 meV ($\approx$3 THz) for optical transitions in QCLs, the intersubband optical nonlinearity for THz DFG is not changing significantly in the 0.5-5 THz range which makes Cherenkov THz DFG-QCLs well suited for broadband THz generation.

Active region 104 and waveguide 110 are designed with insignificant GVD integrated in the active region for a range of operational interest to facilitate the formation of mid-IR FC via FWM in the active region. The QCLs of the present disclosure may be modeled as Fabry-Perot (F-P) resonators. The frequency spacing $\delta\omega$ between adjacent modes in an F-P resonator are given as $$\delta\omega = 2\pi \frac{2L}{c} n_g \quad (2)$$

where L is the resonator length and $n_g$ is the group refractive index for the resonator mode. The group refractive index $n_g$ is related to the group velocity $v_g$ and GVD as $$v_g = c/n_g \text{ and } GVD = \frac{d}{d\omega}\frac{1}{v_g} = \frac{1}{c}\frac{dn_g}{d\omega} \quad (3)$$

For purposes of the present disclosure, the GVD is considered insignificant when $n_g$ is constant or substantially constant, which translates to the GVD being zero or approximately zero. Substantially constant $n_g$ is important to maintain equidistant mid-IR F-P modes to enable frequency comb formation via FWM processes. The phase-matching conditions for these FWM processes also translate into the requirement of a substantially constant $n_g$ within the FC bandwidth.

Figure 3A:
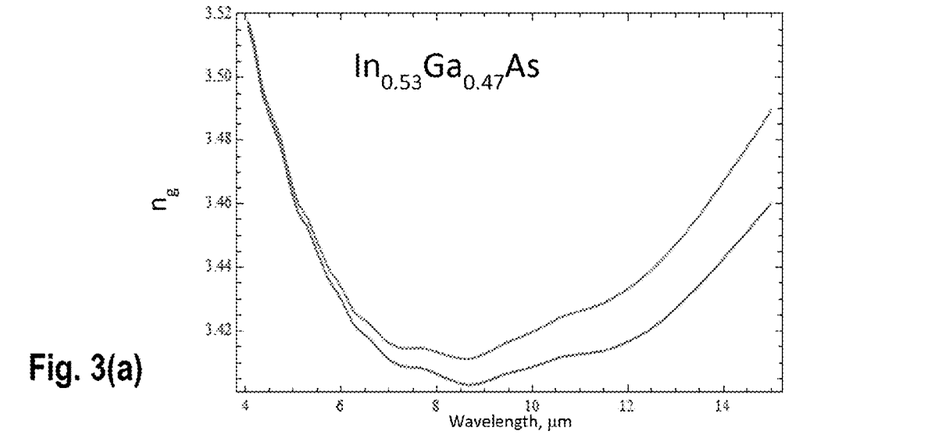
FIG. 3(a) illustrates the calculated group refractive index of a material that may be composing a QCL active region and cladding layers as a function of mid-infrared (mid-IR) wavelength, in accordance with some embodiments.
Figure 3B:
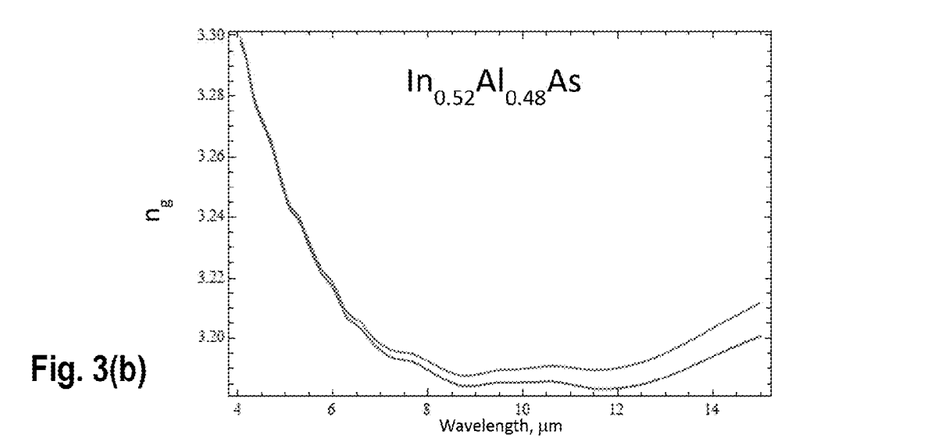
FIG. 3(b) illustrates the calculated group refractive index of another material that may be composing a QCL active region and cladding layers as a function of mid-infrared (mid-IR) wavelength, in accordance with some embodiments.
Figure 3C:
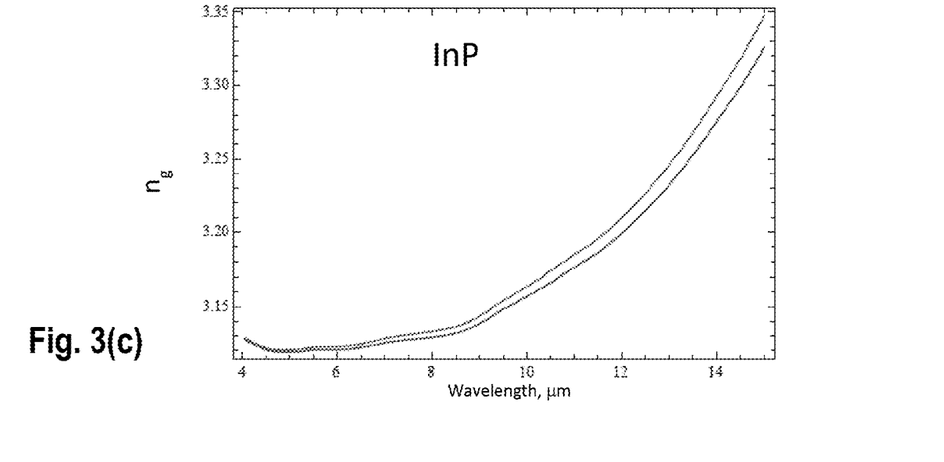
FIG. 3(c) illustrates the calculated group refractive index of yet another material that may be composing a QCL active region and cladding layers as a function of mid-infrared (mid-IR) wavelength, in accordance with some embodiments.

FIG. 3 illustrates the calculated group refractive index of some of the materials that may be composing QCL active region and cladding layers as a function of mid-infrared (mid-IR) wavelength, in accordance with some embodiments. For the illustrated embodiments, the QCL is based on an $In_{0.53}Ga_{0.47}As/Al_{0.52}In_{0.48}As/InP$ materials system. Plot 310 is for the QCL active region and cladding layers are typically n-doped in the range 2-5*$10^{16}$ cm$^{-3}$. The calculated group refractive indices ng vs mid-IR wavelength for $In_{0.53}Ga_{0.47}As$, $Al_{0.52}In_{0.48}As$, and InP are shown in plots 310, 320, and 330. In each plot, the lower curve coincides with the waveguide cladding layers n-doped to n=2*$10^{16}$ cm$^{-3}$, and the upper curve coincides with the waveguide cladding layers n-doped to n=5*$10^{16}$ cm$^{-3}$.

Intersubband transitions that produce laser gain in the QCL active region will also affect GVD of the laser modes. The real and imaginary parts of the refractive index in the active region $n_{AR}+i\kappa_{AR}$ for the electric field perpendicular to the QCL layers in FIG. 1(a) can be estimated as:

$$n_{AR} + i\kappa_{AR} \approx \sqrt{n_{core}^2(\omega) + \sum_i \frac{\Delta N(ez_{1i})^2}{\varepsilon_0 \hbar((\omega_{1i} - \omega) - i\Gamma_{li})}} \approx \quad (4)$$

$$n_{core}(\omega) + (n_{isb}(\omega) + i\kappa_{isb}(\omega)),$$

where $n_{isb}+i\kappa_{isb}$ is the contribution from intersubband transitions. Assuming $n_{core}^2(\omega) \gg |n_{isb}+i\kappa_{isb}|$, we obtain:

$$n_{isb}(\omega) + i\kappa_{isb}(\omega) = \frac{1}{2n_{core}(\omega)} \sum_i \frac{\Delta N(ez_{li})^2}{\varepsilon_0 \hbar((\omega_{li} - \omega) - i\Gamma_{li})}. \quad (5)$$

Figure 5A:
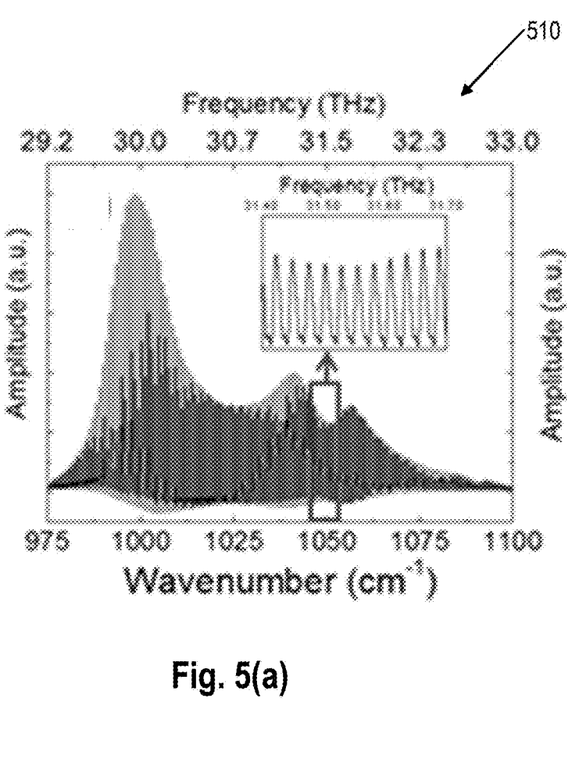
FIG. 5(a) illustrates a mid-IR and terahertz (THz) emission spectrum of a QCL with two quantum cascade heterostructures, in accordance with some embodiments.
Figure 5B:
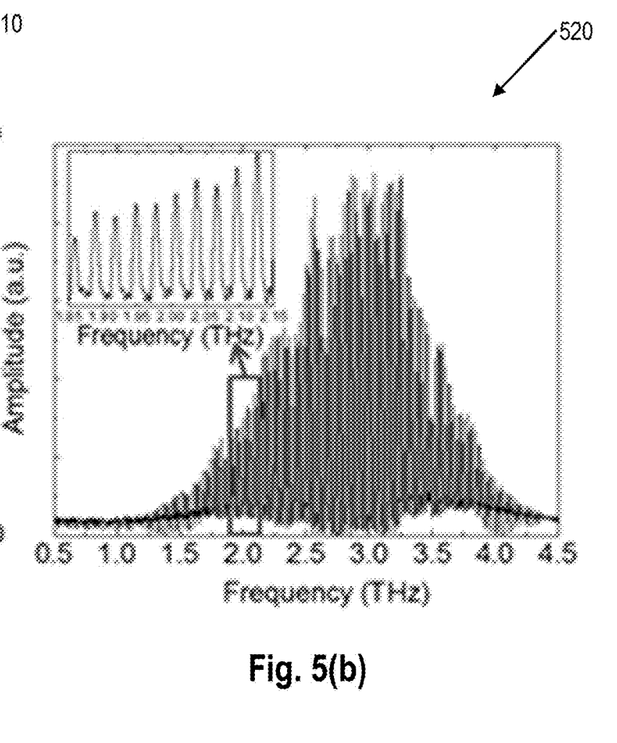
FIG. 5(b) illustrates a mid-IR and terahertz (THz) emission spectrum of a QCL with two quantum cascade heterostructures, in accordance with some embodiments.

Here $\Delta N$ is the population inversion density, the summation goes over transitions from the upper laser state 1 to the various lower laser states i=2, 3, . . . (cf. FIGS. 5(a) and 5(b)), where $ez_{i,j}$, $\omega_{i,j}$ and $\Gamma_{ij}$ are the dipole matrix element, frequency, and broadening of the transition between states i and j, respectively, and $n_{core}(\omega)$ is the refractive index of the active region at zero doping which arises from the intrinsic refractive indices of the QCL active region. The group refractive index in the QCL active region, $n_{g,AR}$, can then be written as $$n_{g,AR}(\omega) = n_{AR} + \omega \frac{dn_{AR}}{d\omega} \approx n_{g,core}(\omega) + n_{g,isb}(\omega), \quad (6)$$

and $n_{g,core}$ and $n_{g,isb}$ are the contributions to $n_{g,AR}$ from the intrinsic refractive indices of the QCL active region. and intersubband transitions, respectively.

Referring to FIG. 3, it is evident that $n_{g,core}$ will contribute insignificant GVD in the 7-10 μm range. The contribution from the dispersion of $n_{g,isb}$ can be a major factor affecting the GVD of mid-IR QCL modes. At high pump current, the laser has significant population inversion $\Delta N$, which results in a strong GVD due to the contribution from $n_{g,isb}$ in Eq. (6).

The problem of having strong GVD due to the QCL gain can be mitigated by using a heterogeneous QCL active region design in which each of the plurality of quantum cascade stages in the active region is designed to provide gain at a slightly different wavelength. In such a way, a region with a relatively flat gain profile in the active region for the waveguide mode will result at least in part in insignificant GVD for the laser modes close to the gain center. By broadening the QCL gain, a region of low dispersion of $n_{g,isb}$ can be created near the peak gain. In contrast, for QCL active regions with narrow gain $n_{g,isb}$, strong dispersions may be experienced near the peak gain. The problem of strong GVD dispersion can also be addressed by using chirped mirrors at the end of the laser cavity.

The active region in the QCLs of the present disclosure are also designed with significant third-order nonlinear susceptibility $\chi^{(3)}$ integrated into the active region to promote efficient mid-IR FC generation via FWM, and significant second-order nonlinear susceptibility $\chi^{(2)}$ integrated into the active region to promote efficient THz DFG. The basic theoretical formalism used in the active region design of the QCLs of present disclosure is described below in the context of QCL with two quantum cascade heterostructures.

Figure 4A:
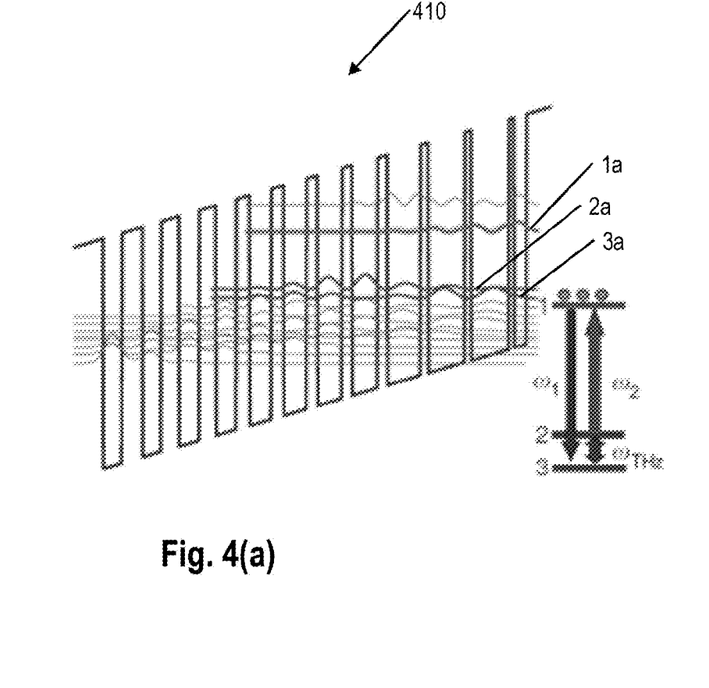
FIG. 4(a) illustrates the conduction band diagram for one period of the active region of a QCL with two quantum cascade heterostructures at the operating bias voltage, in accordance with some embodiments.
Figure 4B:
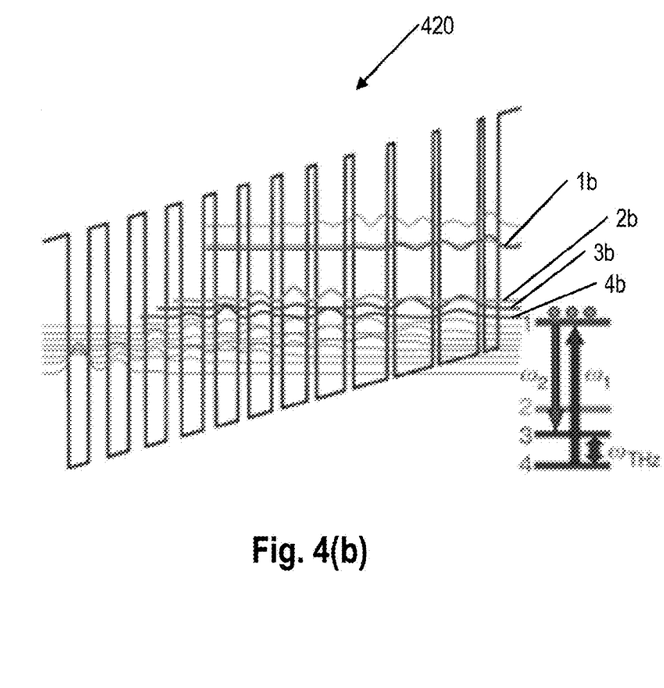
FIG. 4(b) illustrates the conduction band diagram for one period of the active region of a QCL with two quantum cascade heterostructures at the operating bias voltage, in accordance with some embodiments.

FIGS. 4(a) and 4(b) illustrate the conduction band diagram for one period of the active region of a QCL with two quantum cascade heterostructures at the operating bias voltage, in accordance with some embodiments. For the illustrated example, quantum cascade heterostructure 410 comprises 33 quantum cascade stages designed to have peak gain at a wavelength of 8.2 μm, and quantum cascade heterostructure 420 comprises 33 quantum cascade stages designed to have peak gain at a wavelength of 9.2 μm. Each of these quantum cascade heterostructures is designed to possess significant $\chi^{(2)}$, which is given by the expression:

$$\chi^{(2)}(\omega_{THz} = \omega_1 - \omega_2) \approx \qquad (7)$$
$$\Delta N \frac{e^3}{\hbar^2 \varepsilon_0} \frac{z_{12} z_{23} z_{31}}{(\omega_{THz} - \omega_{23} + i\Gamma_{22})} \left( \frac{1}{\omega_1 - \omega_{13} + i\Gamma_{31}} + \frac{1}{-\omega_2 + \omega_{12} + i\Gamma_{21}} \right)$$

where $\omega_1$ and $\omega_2$ are the two mid-IR pump frequencies associated with quantum cascade heterostructures 410 and 420, respectively, $\Delta N$ is the population inversion density, $ez_{i,j}$, $\omega_{i,j}$ and $\Gamma_{ij}$ are the dipole matrix element, frequency, and broadening of the transition between states i and j, respectively. The population inversion in the devices of the present invention can be estimated as $\Delta N \approx 8.5 \times 10^{14}$ cm$^{-3}$ based on the laser gain equals distributed resonator loss' condition. Transition dipole moments and energies were calculated to be $z_{12} \approx 2.2$ nm, $z_{13} \approx 2.2$ nm, $z_{23} \approx 8$ nm, E12≈135 meV and E13≈154 meV for quantum cascade heterostructure 410 and $z_{12} \approx 2.0$ nm, $z_{13} \approx 2.4$ nm, $z_{14} \approx 0.6$ nm, $z_{34} \approx 9.0$ nm, $E_{12} \approx 117$ meV, $E_{13} \approx 134$ meV, and $E_{14} \approx 154$ meV for quantum cascade heterostructure 420. Assuming typical $\Gamma_{ij} \approx 12.5$ meV for the mid-IR transitions and $\Gamma_{ij} \approx 4$ meV for the THz transition, one obtains $|\chi^{(2)}| \approx 22$ nm/V and $|\chi^{(2)}| \approx 10$ nm/V for quantum heterostructures 410 and 420, respectively, at the operating bias voltage. These values of $\chi^{(2)}$ are ~2-4 orders of magnitude larger than that of traditional nonlinear crystals. It has been shown experimentally that the current values of $\chi^{(2)}$ are already sufficient to produce over 100 μW THz DFG power output with 0.6 mW/W2 mid-IR to THz nonlinear conversion efficiency at room temperature from ~1.5 mm-long 25 μm-wide ridge waveguide Cherenkov THz DFG-QCL devices.

The value of intersubband $\chi^{(3)}$ for the mid-IR FWM in the QCL active region can be evaluated using the sum of two-level system expressions:

$$\chi^{(3)}(2\omega_1 - \omega_2 \to \omega_3) \approx \qquad (8)$$
$$\Delta N \frac{2e^4}{3\hbar^3 \varepsilon_0} \sum_i \frac{(z_{li})^4 2i\Gamma_{li}}{(-i\Gamma_{ii})(\omega - \omega_{li} + i\Gamma_{li})^2 (\omega - \omega_{21} - i\Gamma_{li})},$$

where $\omega_1$, $\omega_2$, and $\omega_3$ are three adjacent mid-IR F-P laser modes involved in the FWM process, $\Delta N$ is the population inversion between the upper state 1 and the lower state i as shown in FIGS. 4(a) and 4(b), $\Gamma_{ii}=1/T_i$ where $T_i$ is the lifetime of the lower laser state i (typically, $T_i \sim 0.2$ ps for lower QCL laser states, $\hbar/T_i \approx 3$ meV), $\Gamma_{1i}$ is the transition linewidth between states 1 and i (typically 10-15 meV), and the summation goes over the multitude of the lower laser states i=2, 3 . . . . The difference $\delta\omega$ between frequencies $\omega_1$, $\omega_2$, and $\omega_3$ has been neglected in Eq. (5) and, instead, $\omega \approx \omega_1 \approx \omega_2 \approx \omega_3$ was used in the expression. This is a valid assumption because $\hbar\delta\omega < 0.2$ meV$ \ll \hbar\Gamma_{1i}$ for a typical QCL Fabry-Perot mode spacing of 0.15-1.5 cm-1 in 1-10 mm-long devices.

In accordance with the teachings of the present disclosure, THz FC may be generated from QCLs with active regions that include one or more quantum cascade heterostructures configured/integrated with significant second and third-order nonlinear susceptibilities associated with intersubband transitions and insignificant GVD. FIGS. 5(a) and 5(b) show the mid-IR and terahertz (THz) emission spectra of a QCL with two quantum cascade heterostructures, in accordance with some embodiments. These results were obtained for a QCL with two quantum cascade heterostructures having band structures similar to those shown in FIGS. 4(a) and 4(b) and illustrate the formation of THz FC via DFG of emission lines of a mid-IR FC formed via FWM of the two mid-IR pump frequencies generated by the two quantum cascade heterostructures. The QCL was operated in pulsed mode (100 ns current pulses at 100 kHz repetition frequency) at room temperature at high bias currents (2.5 A pump current) and a broadband mid-IR multi-mode comb-like emission spectrum was observed as shown in FIG. 5(a). The THz emission of the same QCL device was also measured and a comb-like THz spectrum was observed as shown in FIG. 5(b).

Figure 6:
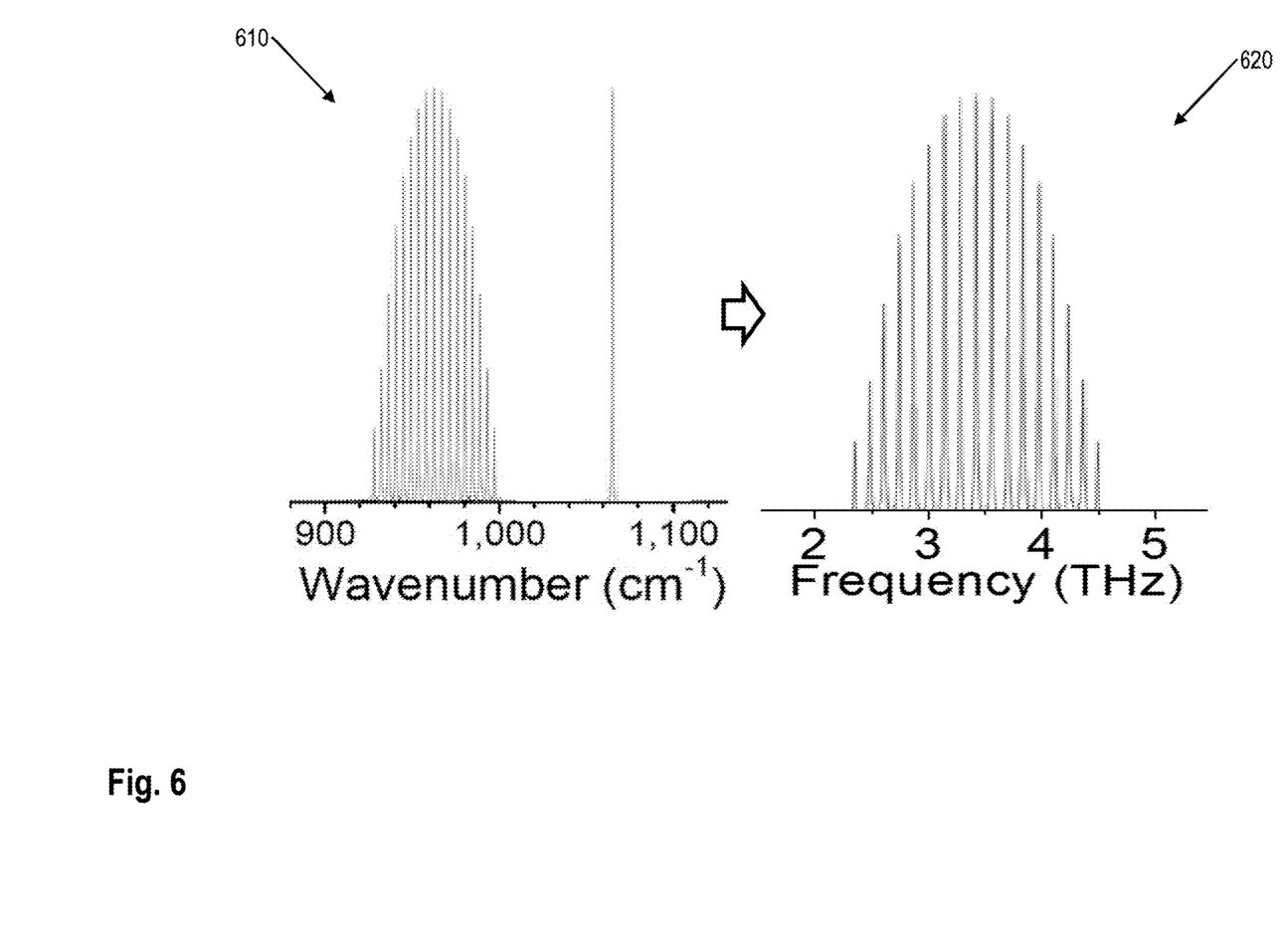
FIG. 6 illustrates mid-IR and terahertz (THz) emission spectra of a QCL employing a feedback grating, in accordance with some embodiments.

FIG. 6 illustrates mid-IR and THz emission spectra of a QCL employing a feedback grating, in accordance with some embodiments. The QCLs described above with respect to FIG. 2 are exemplary QCLs that could be used to generate the illustrated emission spectra. The single or isolated mid-IR frequency shown on the right side of emission spectrum 610 represents a first mid-IR pump frequency generated by the QCL that is selected and fixed by adjusting the periodicity of the feedback grating. The mid-IR FC positioned to the left of the single mid-IR frequency results from four-wave mixing of a second mid-1R pump frequency generated by the OCL, which is allowed to operate in a multi-mode Fabry-Perot regime. The mid-IR FC is localized about the second mid-IR pump frequency. Difference-frequency generation in the active region of the QCL between the first mid-IR pump frequency and the emission lines of the mid-IR FC leads to the THz FC shown in emission spectrum 620. It should be appreciated that the DFG process applied only to the mid-IR FC would results in a THz FC. However, the resulting THz FC may extend over a different range of THz frequencies. Use of the single mid-IR frequency in this fashion effectively shifts the FC from mid-infrared to THz. In the illustrated embodiment, the first mid-IR pump frequency is greater than the second mid-IR pump frequency. In other embodiments, the first mid-IR pump frequency can be selected to be less than the second mid-IR pump frequency.

In cases where feedback grating 225 comprises multiple, independently biased DBRs as discussed above, THz emission spectra comprising sets of THz FC may be generated by suitable adjustment of the independent biases. By adjusting the bias associated with particular DBRs, THz FCs within the set of THz FC may be selectively turned on or off, thereby allowing the controlled selection of subset of the set of THz FCs.

Figure 7A:
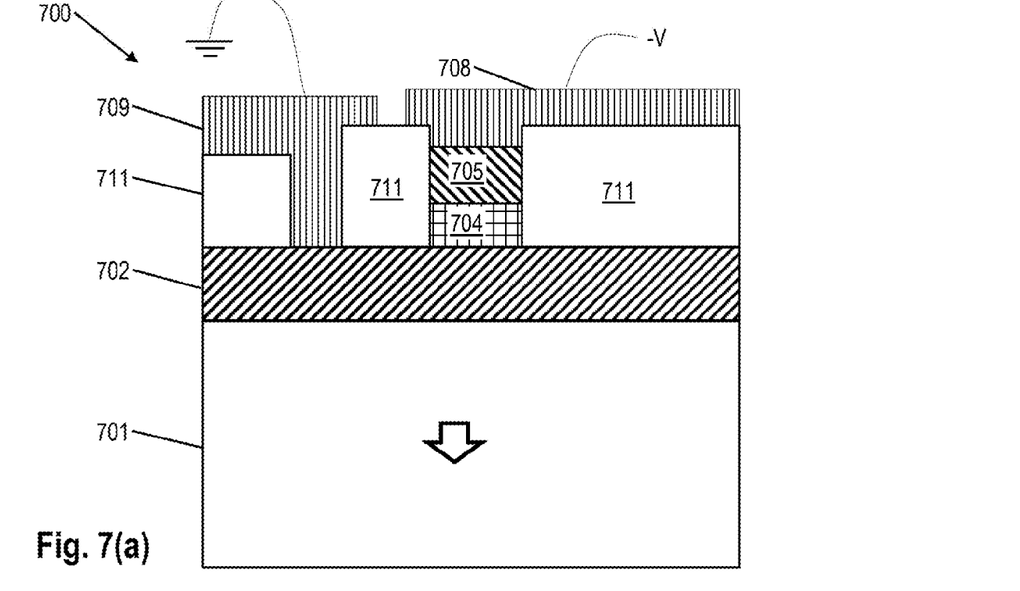
FIG. 7(a) illustrates a QCL implemented as a buried-heterostructure device grown on a semi-insulating substrate, in accordance with some embodiments.
Figure 7B:
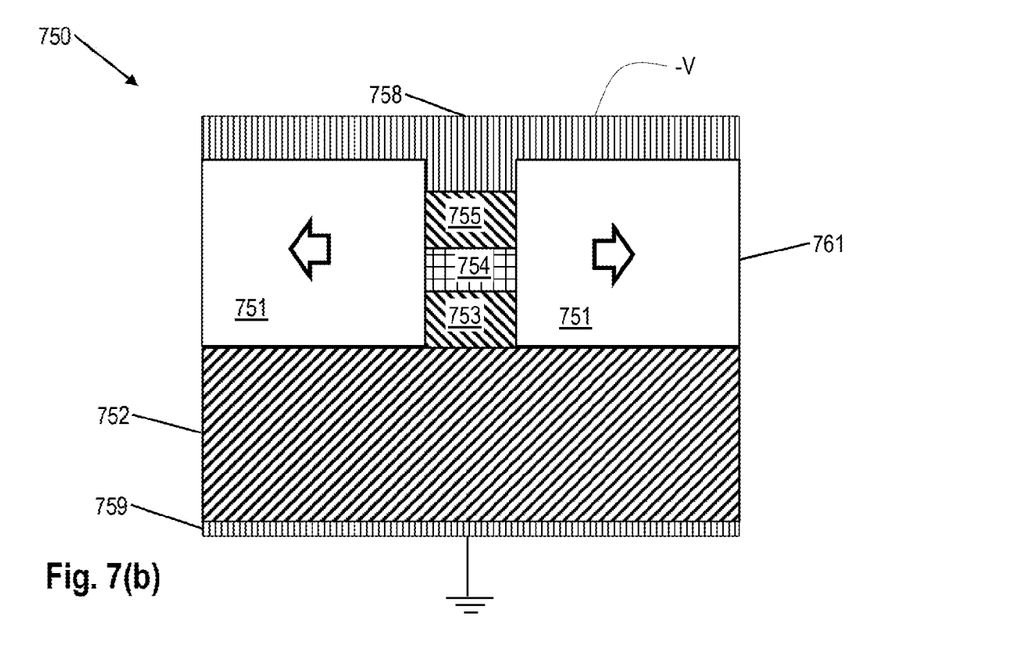
FIG. 7(b) illustrates a QCL implemented as a buried-heterostructure device, where the buried-heterostructure device is grown on a doped substrate connected to ground, in accordance with some embodiments.

The QCL devices disclosed herein may be operated as pulsed mode or continuous wave (CW) lasers. For certain applications, CW operation at room temperatures may be useful. Exemplary configurations of QCL devices with thermal packaging to achieve CW operation at room temperature are shown in FIGS. 7(*a*)-7(*b*). The elements of the QCL devices shown in FIGS. 7(*a*)-7(*b*) that utilize the elements of quantum cascade laser 100 of FIGS. 1(*a*) and 1(*b*) reference the element numbers discussed in connection with FIGS. 1(*a*) and 1(*b*).

FIG. 7(*a*) illustrates a QCL implemented as a buried-heterostructure device grown on a semi-insulating substrate, in accordance with some embodiments. QCL 700 includes semi-insulating substrate 701 with an etched contact path 709 to current extraction layer 702. In some embodiments, substrate 701 may be comprised of a III-V semiconductor compound, such as InP. QCL 700 further includes active region 704, cladding layer 705 and contact layer 708 connected to a source potential. QCL 700 additionally includes overgrown layers of semi-insulating InP 711 positioned on the sides of active region 704 and cladding layer 705 as well as at an outer edge of device 700. As illustrated, contact path 708 is etched between a pair of the overgrown layers 711, where contact path 709 is etched to current extraction semiconductor layer 702. In one embodiment, the contact layer that is filled in contact path 709 is connected to ground. Cherenkov THz DFG radiation is extracted through substrate 701 (as indicated by the arrow) as described above in more detail in connection with FIG. 1.

FIG. 7(*b*) illustrates a QCL implemented as a buried-heterostructure device, where the buried-heterostructure device is grown on a doped substrate connected to ground, in accordance with some embodiments. QCL 750 is shown formed on a doped substrate 752 connected to ground through contact path 759. QCL 750 further includes active region 754 sandwiched between cladding layers 753 and 755. Cherenkov THz DFG radiation is extracted laterally (as indicated by the arrows) through overgrown layers of semi-insulating InP 751. QCL 750 further includes a contact layer 758 connected to a source potential.

In other embodiments, the substrate 752 in FIG. 7(*b*) may be undoped or doped at a very low concentration (e.g., at a concentration of $<10^{16}$ cm$^{-3}$), in accordance with some embodiments. In such embodiments, Cherenkov THz DFG radiation may be additionally extracted through substrate 752 as described above in more detail in connection with FIG. 1. It should be noted that the nonlinear polarization wave in active region 754 may continue to emit Cherenkov THz waves laterally if the refractive index of the lateral material is higher than the mid-IR $n_g$ of the active region.

Figure 8:
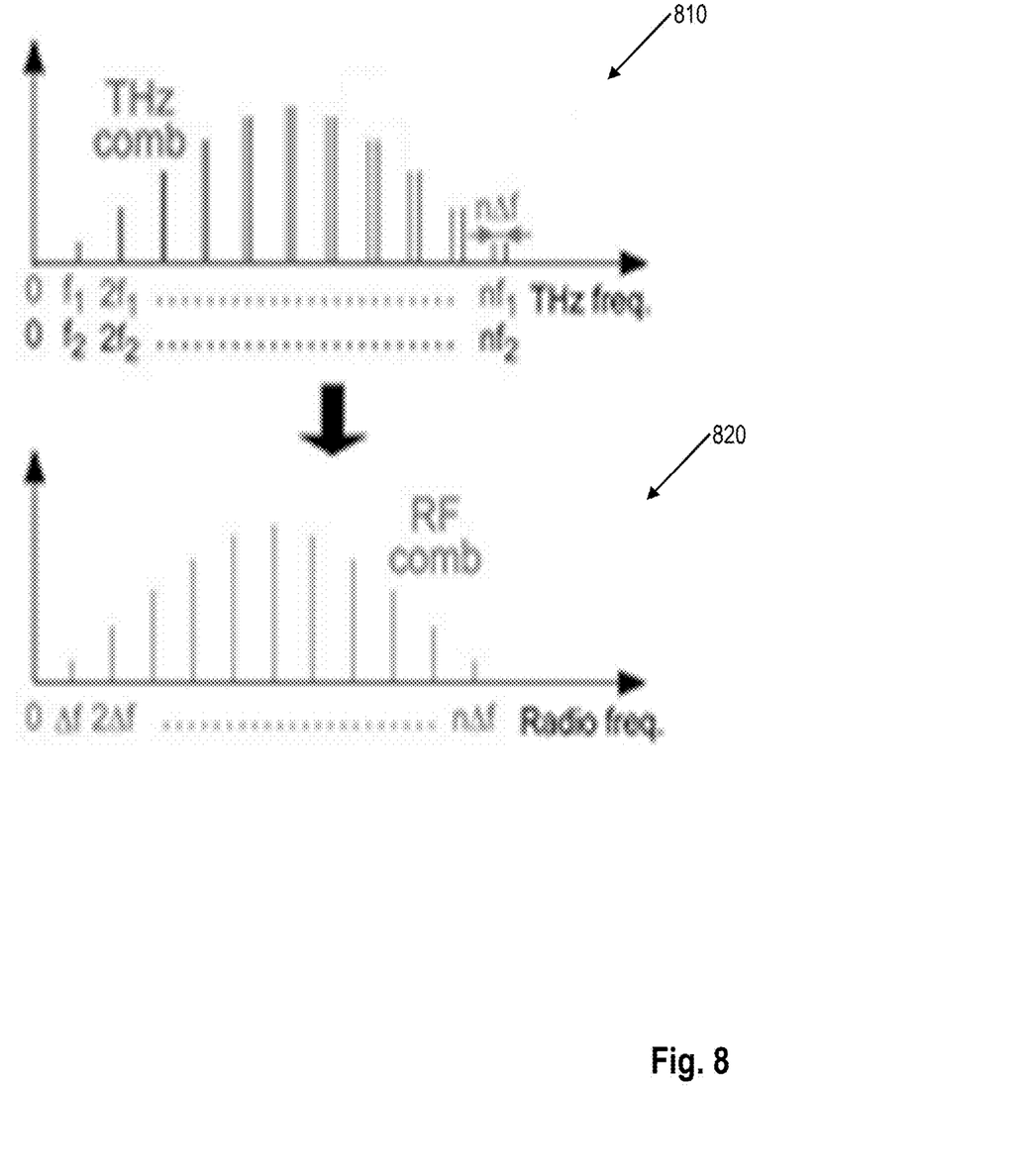
FIG. 8 illustrates how a terahertz frequency comb may be used for spectroscopy, in accordance with some embodiments.

The graphs in FIG. 8 illustrate how terahertz spectroscopy may be performed, in some embodiments. A terahertz frequency beam (for example, a terahertz frequency comb beam) may be sent through a sample that is to be analyzed. In this example, the terahertz beam may contain a harmonic series of evenly spaced terahertz frequencies $nf_1$, where $n=1 \ldots N$. The probe beam may be then superimposed on a heterodyne detector with another terahertz frequency comb (for example, from a local oscillator) with a slightly different frequency spacing $nf_2$ as shown in graph 810. The two beams then interfere to produce power modulation at radio-frequencies (RF) beat nodes $\Delta fn$ on a heterodyne detector, where $\Delta f=|f1-f2|\ll f1, f2$ as shown in graph 820. The RF beat node $\Delta fn$ may be viewed as a heterodyne signal that measures $n^{th}$ comb component of the probe beam. The set of RF beat nodes at frequencies $\Delta fn$, $n=1 \ldots N$ provides information on the intensities of the frequency-components of the probe frequency comb.

Thus, a frequency comb terahertz spectrometer may be created that consists of a frequency comb probe source, a frequency comb local oscillator, a sample, a detector, and an RF spectrum analyzer configured to detect RF beat nodes resulting from the heterodyne detector. Such a spectrometer may have no moving parts, may measure sample spectral properties simultaneously for all frequency comb frequencies, and may be highly sensitive due to heterodyne detection principle.

Figure 9A:
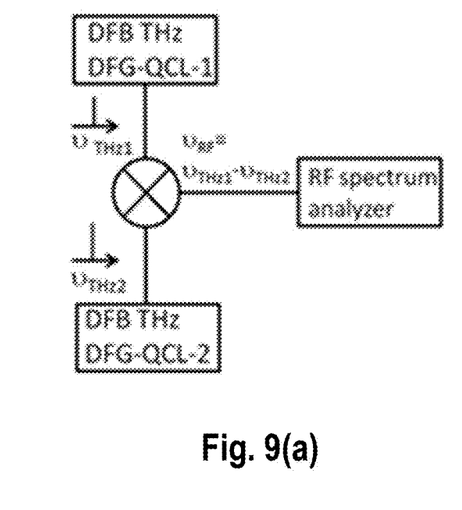
FIG. 9(a) shows a schematic of a heterodyne-based setup for observing terahertz radiation generation and terahertz radiation spectroscopy, in accordance with some embodiments.
Figure 9B:
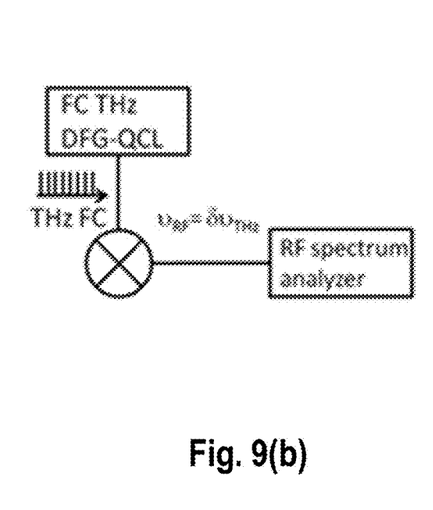
FIG. 9(b) shows a schematic of a heterodyne-based setup for observing terahertz radiation generation and terahertz radiation spectroscopy, in accordance with some embodiments.
Figure 9C:
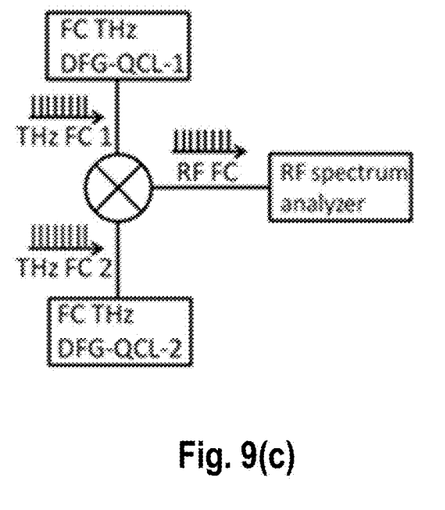
FIG. 9(c) shows a schematic of a heterodyne-based setup for observing terahertz radiation generation and terahertz radiation spectroscopy, in accordance with some embodiments.

FIGS. 9 (*a*), (*b*), and (*c*) show schematics of various heterodyne-based setups for observing terahertz radiation generation and terahertz radiation spectroscopy. FIG. 9(*a*) shows a setup for linewidth characterization of a single terahertz frequency distributed feedback (DFB) emitters. FIG. 9(*b*) shows a setup for observing beat node between terahertz frequency components. FIG. 9(*c*) shows a setup for observing the beat nodes from the entire terahertz frequency comb and for performing terahertz spectroscopy.

The systems may be used to characterize the emission linewidth of a fixed-frequency distributed feedback terahertz DFG-QCL sources. In such experiments, output from one single-terahertz frequency DFG-QCL may be mixed with that from another single terahertz frequency DFG-QCL with slightly shifted terahertz emission. The generated beats modes may be used to determine terahertz emission linewidth. In addition, terahertz emission linewidth of terahertz DFG-QCLs in pulsed and CW operation may be compared to determine whether terahertz emission from DFG-QCLs remains narrow in pulsed operation.

Figure 10:
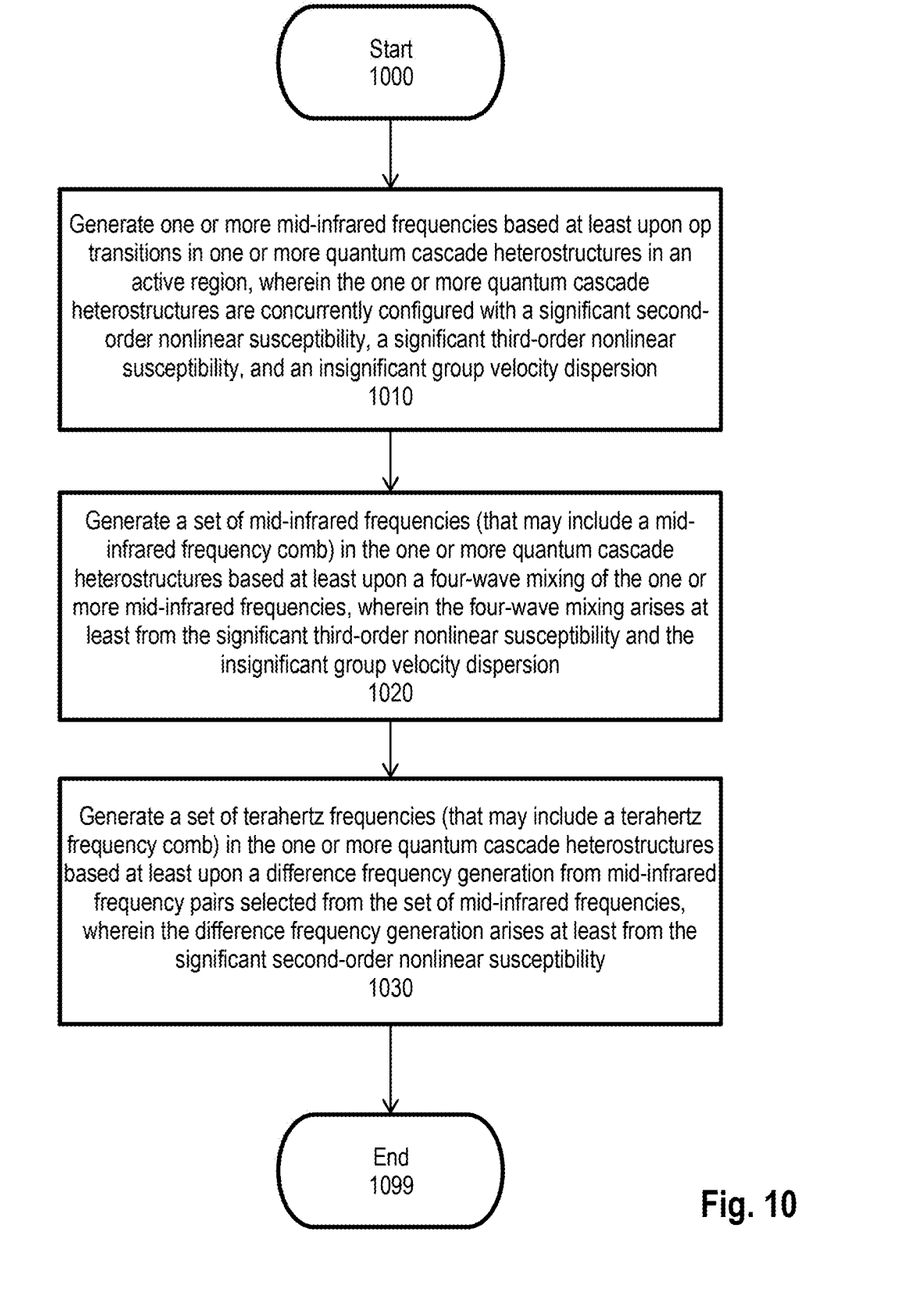
FIG. 10 is a flow diagram illustrating a method for generating terahertz frequency combs based on difference frequency generation (DFG) in an active region of a quantum cascade laser (QCL), in accordance with some embodiments.

FIG. 10 is a flow diagram illustrating a method for generating terahertz frequency combs based on difference frequency generation (DFG) in an active region of a quantum cascade laser (QCL), in accordance with some embodiments.

In some embodiments, the method described here may be implemented using one or more of the devices described and shown in one or more of the previous figures.

The method begins at 1000 where, at block 1010, one or more mid-infrared frequencies are generated based at least upon optical transitions in one or more quantum cascade heterostructures in an active region. The one or more quantum cascade heterostructures are concurrently configured with a significant second-order nonlinear susceptibility, a significant third-order nonlinear susceptibility, and an insignificant group velocity dispersion for mid-infrared laser modes.

At block 1020, a set of mid-infrared frequencies (that may include a mid-infrared frequency comb) is generated in the one or more quantum cascade heterostructures based at least upon a four-wave mixing of the one or more mid-infrared frequencies. The four-wave mixing arises at least from the significant third-order nonlinear susceptibility and the insignificant group velocity dispersion.

At block 1030, a set of terahertz frequencies (that may include a mid-infrared frequency comb) is generated in the one or more quantum cascade heterostructures based at least upon a difference frequency generation from mid-infrared frequency pairs selected from the set of mid-infrared frequencies. The difference frequency generation arises at least from the significant second-order nonlinear susceptibility.

The method subsequently ends at 1099.

One or more embodiments are disclosed. It should be noted that these and any other embodiments are exemplary and are intended to be illustrative rather than limiting. While what is disclosed is widely applicable to various types of systems, a skilled person will recognize that it is impossible to include all of the possible embodiments and contexts in this disclosure. Upon reading this disclosure, many alternative embodiments will be apparent to persons of ordinary skill in the art.

Those of skill will appreciate that the various illustrative logical blocks, modules, circuits, and steps described in connection with the embodiments disclosed herein may be implemented as hardware, firmware, software, or combinations of those. To illustrate clearly this interchangeability of hardware, firmware, and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A quantum cascade laser device, comprising
an active region, wherein the active region comprises one or more quantum cascade heterostructures concurrently configured with a significant second-order nonlinear susceptibility, a significant third-order nonlinear susceptibility for mid-infrared frequencies, and an insignificant group velocity dispersion,
wherein the one or more quantum cascade heterostructures are configured to generate mid-infrared frequencies, wherein at least some of the mid-infrared frequencies comprise a mid-infrared frequency comb, based at least upon a four-wave mixing of one or more mid-infrared frequencies generated by the one or more quantum cascade heterostructures, the four-wave mixing based at least upon the significant third-order nonlinear susceptibility and the insignificant group velocity dispersion, and
wherein the one or more quantum cascade heterostructures are configured to generate a terahertz frequency comb based at least upon a difference-frequency generation between the mid-infrared frequencies, arising at least from the significant second-order nonlinear susceptibility.

2. The device of claim 1, further comprising a feedback grating layer positioned above an upper surface of the active region, wherein a mid-infrared frequency comb is localized about a first group of mid-infrared frequencies generated by the one or more quantum cascade heterostructures, wherein the feedback grating layer is configured to select a second mid-infrared frequency generated by the one or more quantum cascade heterostructures, and wherein the one or more quantum cascade heterostructures are configured to generate the terahertz frequency comb based at least upon a difference frequency generation between the second mid-infrared frequency and emission lines of the mid-infrared frequency comb localized about the first mid-infrared frequency.

3. The device of claim 2, wherein the second mid-infrared frequency is less than or greater than the first mid-infrared frequency.

4. The device of claim 1, wherein the one or more quantum cascade heterostructures in the active region comprises a plurality of quantum cascade stages configured to provide gain in the active region at slightly different wavelengths, resulting in a region with a relatively flat gain profile in the active region that contributes at least in part to the insignificant group velocity dispersion.

5. The device of claim 1, wherein the quantum cascade laser comprises a Cherenkov waveguide configured to emit the terahertz frequency comb into a substrate positioned below the active region.

6. A method comprising:
generating one or more mid-infrared frequencies based at least upon optical transitions in one or more quantum cascade heterostructures in an active region, wherein the one or more quantum cascade heterostructures are concurrently configured with a significant second-order nonlinear susceptibility, a significant third-order nonlinear susceptibility, and an insignificant group velocity dispersion;
generating a set of mid-infrared frequencies in the one or more quantum cascade heterostructures based at least upon a four-wave mixing of the one or more mid-infrared frequencies, wherein the four-wave mixing arises at least from the significant third-order nonlinear susceptibility and the insignificant group velocity dispersion;
generating a set of terahertz frequencies in the one or more quantum cascade heterostructures based at least upon a difference-frequency generation from mid-infrared frequency pairs selected from the set of mid-infrared frequencies, wherein the difference frequency generation arises at least from the significant second-order nonlinear susceptibility.

7. The method of claim 6, wherein the set of mid-infrared frequencies comprises a mid-infrared frequency comb and wherein the set of terahertz frequencies comprises a terahertz frequency comb.

8. The method of claim 7, further comprising selecting an isolated mid-infrared frequency from the set of mid-infrared frequencies based at least upon a feedback grating layer, wherein the isolated frequency is one of the frequencies in the mid-infrared frequency pairs used to generate terahertz radiation.

9. The method of claim 8, wherein the mid-infrared frequency is lower or higher than the terahertz frequency comb.

10. The method of claim 6, wherein the one or more quantum cascade heterostructures comprise a plurality of quantum cascade stages configured to provide gain in the active region at slightly different wavelengths, resulting in a region with a relatively flat gain profile in the active region that contributes at least in part to the insignificant group velocity dispersion.

11. A device comprising
an active region, wherein the active region comprises one or more quantum cascade heterostructures configured concurrently with significant second-order nonlinear susceptibility, significant third-order nonlinear susceptibility, and insignificant group velocity dispersion (GVD),
wherein the one or more quantum cascade heterostructures are configured to generate one or more mid-infrared frequencies,
wherein the one or more quantum cascade heterostructures are configured to generate a set of mid-infrared frequencies based at least upon a four-wave mixing of the one or more mid-infrared frequencies, wherein the four-wave mixing arises at least from the significant third-order nonlinear susceptibility and the insignificant group velocity dispersion,
wherein the one or more quantum cascade heterostructures are configured to generate a set of terahertz frequencies based at least upon a difference frequency generation from mid-infrared frequency pairs selected from the set of mid-infrared frequencies, wherein the difference frequency generation arises from the significant second-order nonlinear susceptibility.

12. The device of claim 11, wherein the set of mid-infrared frequencies comprises a mid-infrared frequency comb and wherein the set of terahertz frequencies comprises a terahertz frequency comb.

13. The device of claim 12, further comprising a feedback grating layer positioned above an upper surface of the active region, wherein the mid-infrared frequency comb is localized about a first mid-infrared frequency generated by the one or more quantum cascade heterostructures, wherein the feedback grating layer is configured to select a second mid-infrared frequency generated by the one or more quantum cascade heterostructures, and wherein the one or more quantum cascade heterostructures are configured to generate the terahertz frequency comb based at least upon a difference frequency generation between the second mid-infrared frequency and emission lines of the mid-infrared frequency comb localized about the first mid-infrared frequency.

14. The device of claim 13, wherein the second mid-infrared frequency is less than or greater than the first mid-infrared frequency.

15. The device of claim 11, wherein the quantum cascade laser comprises a Cherenkov waveguide configured to emit the set of terahertz frequencies into a substrate positioned below the active region.

16. The device of claim 11, further comprising a feedback grating layer positioned above an upper surface of the active region,
wherein the feedback grating comprises multiple distributed Bragg reflectors (DBRs),
wherein each of the multiple DBRs is configured to select a different mid-infrared frequency from the one or more mid-infrared frequencies,
wherein each of the multiple DBRs is configured to be independently biased from the other multiple DBRs,
wherein the set of terahertz frequencies comprises a set of terahertz frequency combs, and
wherein a subset of the set of terahertz frequency combs may be selected in response to a controlled adjustment of the independent biases of the multiple DBRs.

* * * * *